(12) United States Patent
Kamada

(10) Patent No.: US 10,347,555 B2
(45) Date of Patent: Jul. 9, 2019

(54) ELECTRONIC DEVICE AND METHOD FOR MANUFACTURING ELECTRONIC DEVICE

(71) Applicant: SHINDENGEN ELECTRIC MANUFACTURING CO., LTD., Tokyo (JP)

(72) Inventor: Hideki Kamada, Hanno (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 15/757,947

(22) PCT Filed: Dec. 26, 2016

(86) PCT No.: PCT/JP2016/088630
§ 371 (c)(1),
(2) Date: Mar. 6, 2018

(87) PCT Pub. No.: WO2018/122897
PCT Pub. Date: Jul. 5, 2018

(65) Prior Publication Data
US 2018/0342436 A1   Nov. 29, 2018

(51) Int. Cl.
*H01L 23/31* (2006.01)
*H01L 23/24* (2006.01)
(Continued)

(52) U.S. Cl.
CPC .......... *H01L 23/3121* (2013.01); *H01L 21/56* (2013.01); *H01L 21/565* (2013.01);
(Continued)

(58) Field of Classification Search
CPC ....... H01L 21/56; H01L 21/565; H01L 23/24; H01L 23/28; H01L 23/3121; H01L 23/564
See application file for complete search history.

(56) References Cited

U.S. PATENT DOCUMENTS 7,196,413 B2 * 3/2007 Shibuya ............... C09K 5/14
257/706
9,129,932 B2 * 9/2015 Hayashi ................ H01L 23/24
(Continued)

FOREIGN PATENT DOCUMENTS

JP   H05031246 U   4/1993
JP   2010129868 A   6/2010
(Continued)

OTHER PUBLICATIONS

International Search Report for PCT/JP2016/088630, dated Feb. 7, 2017, and its English translation provided by Bing Translator.
(Continued)

*Primary Examiner* — Allan R Wilson
(74) *Attorney, Agent, or Firm* — Ladas & Parry, LLP

(57) ABSTRACT

An electronic device has a substrate 10, an electronic element 80 provided on the substrate 10 and a sealing part 20 for sealing the electronic element 80. The sealing part 20 has an insertion part 22 for inserting a fastening member 90. The insertion part 22 is provided in a sealing recessed part 25 recessed compared with a circumferential region. At least side surface and the sealing recessed part 25 of the sealing part 20 are exposed to the outside.

6 Claims, 6 Drawing Sheets

(51) Int. Cl.
*H01L 23/00* (2006.01)
*H01L 21/56* (2006.01)
*H01L 23/28* (2006.01)

(52) U.S. Cl.
CPC .............. *H01L 23/24* (2013.01); *H01L 23/28* (2013.01); *H01L 23/564* (2013.01)

(56) References Cited

U.S. PATENT DOCUMENTS

| | | | |
|---|---|---|---|
| 2010/0133684 A1 | 6/2010 | Oka et al. | |
| 2013/0285234 A1* | 10/2013 | Uhlemann | H01L 23/3677 257/712 |
| 2014/0077349 A1* | 3/2014 | Higgins, III | H01L 21/565 257/692 |
| 2014/0346676 A1* | 11/2014 | Horio | H01L 25/18 257/773 |
| 2016/0161314 A1* | 6/2016 | Hunziker | G01F 1/688 73/204.21 |
| 2016/0233146 A1 | 8/2016 | Nakamura | |
| 2018/0114735 A1* | 4/2018 | Nakamura | H01L 23/49838 |

FOREIGN PATENT DOCUMENTS

| | | |
|---|---|---|
| JP | 2011238803 A | 11/2011 |
| JP | 2015220295 A | 12/2015 |
| WO | 2015151235 A1 | 10/2015 |

OTHER PUBLICATIONS

International Preliminary Examination Report for PCT/JP2016/088630, dated Jun. 2, 2017, and its English translation provided by Bing Translator.
Written Opinion for PCT/JP2016/088630, dated Feb. 7, 2017, and its English translation provided by Bing Translator.

* cited by examiner (a)

(b)

(c)

(d)

ELECTRONIC DEVICE AND METHOD FOR MANUFACTURING ELECTRONIC DEVICE

CROSS-REFERENCE TO RELATED APPLICATION

The present application is the U.S. national phase of PCT Application PCT/JP2016/088630 filed on Dec. 26, 2016, the disclosure of which is incorporated herein by reference in its entirety.

TECHNICAL FIELD

The present invention relates to an electronic device and a method for manufacturing the electronic device.

BACKGROUND ART

In an electronic device such as a semiconductor device such as a conventional resin potting product, resin is poured into a product obtained by bonding a substrate and a case with an adhesive or the like, and is heated and cured. Such a resin potting product has a substrate, an electronic element provided on the substrate, a sealing part made of resin for sealing the electronic element, a terminal connected to the electronic element and protruding from the sealing part, and a case covering a side surface of the sealing part (for example, see JP 2015-220295 A). Such an electronic device is sometimes fixed to a substrate, a casing or the like by a fastening member such as a screw, and there is a likelihood that deterioration with time of the interface between the case and the sealing part will cause a quality problem due to peeling or the like. Therefore, use of an electronic device without a case is considered, and it is also required to increase the degree of freedom of design of such an electronic device without a case.

SUMMARY OF INVENTION

Technical Problem

In view of the above point, the present invention provides an electronic device and a method for manufacturing the electronic device in which at least a side surface of a sealing part is exposed to the outside so as to prevent problems such as peeling at an interface between the side surface of the sealing part and a case, and which can increase the degree of freedom of design.

Solution to Problem

An electronic device, according to one embodiment of the present invention, may comprise:
a substrate;
an electronic element provided on the substrate; and
a sealing part for sealing the electronic element,
wherein the sealing part has an insertion part for inserting a fastening member,
wherein the insertion part is provided in a sealing recessed part recessed compared with a circumferential region, and
wherein at least side surface and the sealing recessed part of the sealing part are exposed to outside.

In the electronic device, according to one embodiment of the present invention,
depth of the insertion part may correspond to length of the fastening member.

In the electronic device, according to one embodiment of the present invention,
the sealing recessed part may have an edge part formed by the side surface and a front surface of the sealing recessed part, and
the edge part may not be chamfered.

In the electronic device, according to one embodiment of the present invention,
a lower circumferential part of the sealing part may be chamfered.

In the electronic device, according to one embodiment of the present invention,
an entire side surface and an entire front surface of the sealing part may be exposed to the outside.

The electronic device, according to one embodiment of the present invention, may further comprise
a terminal connected to the electronic element and protruding to the outside from a front surface of the sealing part.

A manufacturing method for an electronic device, according to one embodiment of the present invention, may comprise:
a step of placing a substrate, on which an electronic element is provided, on a mold;
a step of placing an insertion part for inserting a fastening member on the substrate; and
a step of pouring resin which is a material of a sealing part, while apart of the substrate is pressed by the insertion part which is pressed by a projecting part of a mold,
wherein the electronic device may have a sealing recessed part, which corresponds to the projecting part of the mold, and at least side surface and the sealing recessed part of the sealing part are exposed to outside.

Effect of Invention

The present invention provides an electronic device, in which the side surface of the sealing part is exposed to the outside is adopted. Thus, there is no interface between the side surface of the sealing part and the case, and it is possible to prevent the likelihood that a quality problem due to peeling or the like will occur. Further, the degree of freedom of design can be increased by appropriately providing the recessed part.

DESCRIPTION OF EMBODIMENTS

Embodiment

<<Configuration>>

Figure 1:
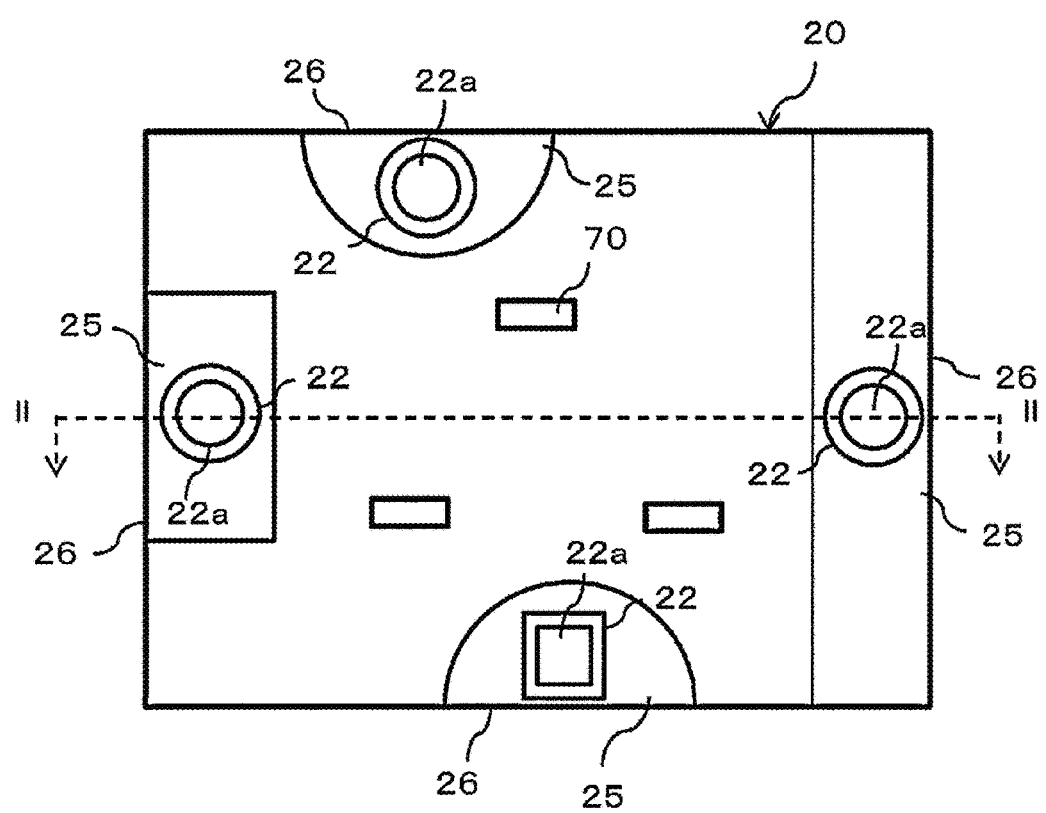
FIG. 1 is a plan view of an electronic device according to an embodiment of the present invention.
Figure 2:
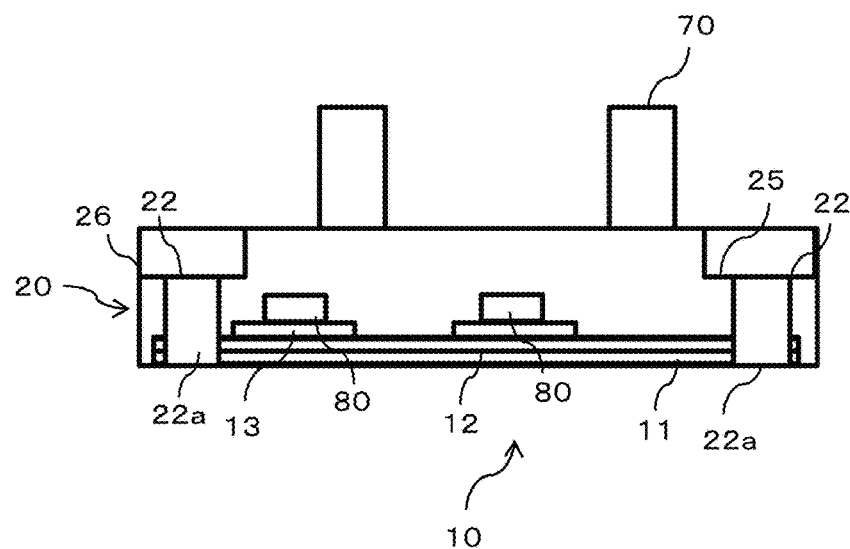
FIG. 2 is a side sectional view of the electronic device according to the embodiment of the present invention taken along line II-II in FIG. 1.

As illustrated in FIG. 2, an electronic device of the present embodiment may have a substrate 10, an electronic element 80 such as a semiconductor element provided on the substrate 10 with a conductor layer 13 to be described later interposed therebetween, and a sealing part 20 made of a resin material for sealing the electronic element 80. As illustrated in FIG. 1, the sealing part 20 may have an insertion part 22 for inserting a fastening member 90 such as a screw. The insertion part 22 may be provided in a sealing recessed part 25 recessed compared with a circumferential region. The insertion part 22 may be made of a metal material, and an insertion hole 22a into which the fastening member 90 is inserted may be provided at the center of the insertion part 22. The insertion part 22 may be threaded to engage with the fastening member 90.

In the present embodiment, a semiconductor device can be given as an example of the electronic device, and a semiconductor element can be given as an example of the electronic element 80. However, the present invention is not limited to them, and it is not necessary to use a "semiconductor".

As illustrated in FIG. 2, the substrate 10 may have a metal plate 11, an insulating layer 12 provided on the metal plate 11, and a conductor layer 13 provided on the insulating layer 12. In addition, a circuit may be formed by patterning the conductor layer 13 on the insulating layer 12. The metal plate 11 may function as a heatsink. The metal plate 11 and the conductor layer 13 may be made of copper, for example.

Figure 4:
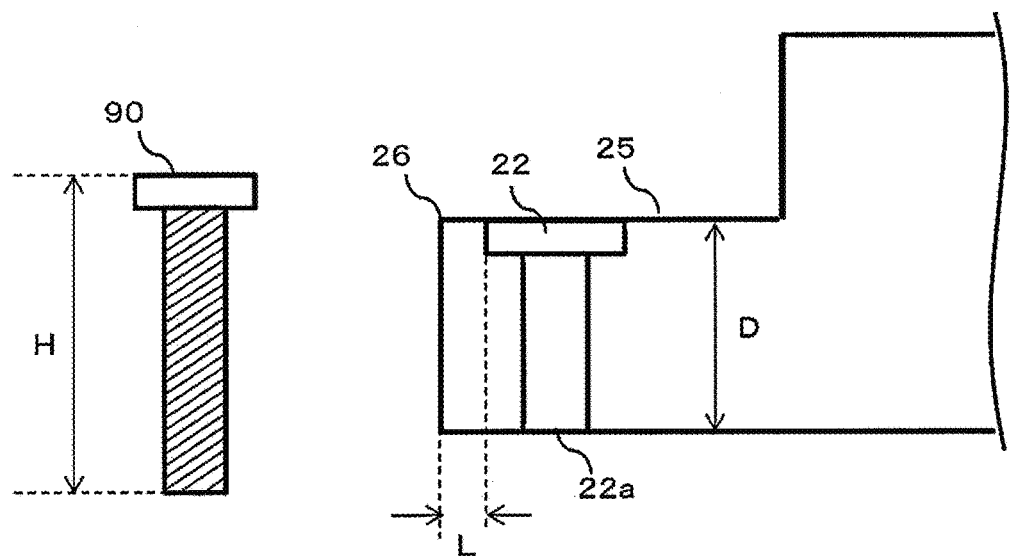
FIG. 4 is a side sectional view illustrating the electronic device and a fastening member according to the embodiment of the present invention in an enlarged manner.

As illustrated in FIG. 4, depth D of the insertion part 22 may correspond to length H of the fastening member 90. The depth D of the insertion part 22 "corresponds to length H of the fastening member 90" means that the depth D of the insertion part 22 is shorter than the length H of the fastening member 90 by a predetermined length (for example, 0.7× H≤D≤0.9H), and the depth D is set so that there is no problem in inserting the fastening member 90 into the insertion part 22 and fixing the electronic device at a predetermined location.

As illustrated in FIG. 2, the sealing recessed part 25 may have an edge part 26 formed by a side surface and a front surface of the sealing recessed part 25. The edge part 26 may not be chamfered. Here, the edge part 26 "is not chamfered" means that the radius in the cross section of the edge part 26 is less than 0.5 mm. A distance L greater than or equal to a predetermined distance, for example, greater than or equal to 0.5 cm, may be provided between the edge part 26 and the insertion part 22 (see FIG. 4). By providing the distance L greater than or equal to a certain value as described above, it can be expected that a capillary phenomenon to be described later is easily caused.

At least the side surface of the sealing part 20 and the sealing recessed part 25 may be exposed to the outside. In addition, the entire side surface and the entire front surface of the sealing part 20 may be exposed to the outside. "Exposed to the outside" means that there is no frame body surrounding the electronic device, and means that the electronic device is a so-called caseless device. The aspect illustrated in the drawings of the present embodiment is a caseless aspect.

As illustrated in FIG. 2, a terminal 70 connected to the electronic element 80 and protruding to the outside from the front surface of the sealing part 20 may be provided. In addition, the terminal 70 may be straight without being bent. In the case where the terminal 70 described above is provided, sealing is generally performed by potting in which less pressure is applied.

Figure 5:
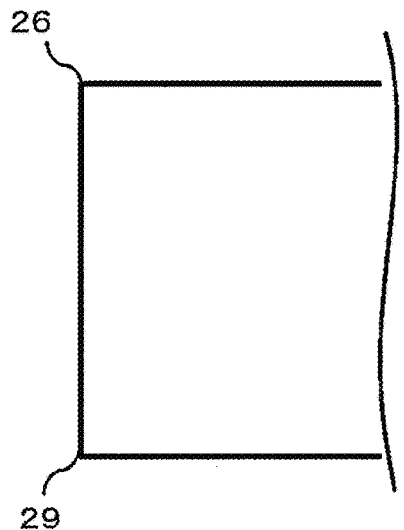
FIG. 5 is a side sectional view illustrating the vicinity of an edge part of a recessed part used in the embodiment of the present invention.
Figure 5:
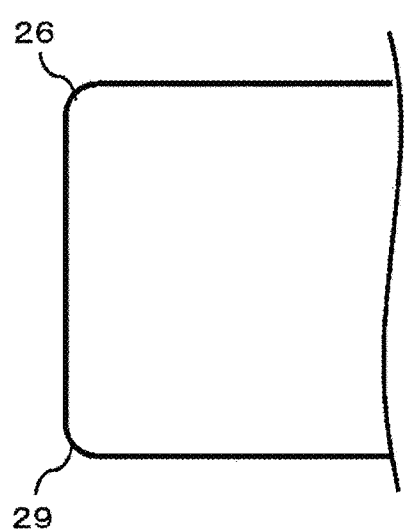
Figure 5:
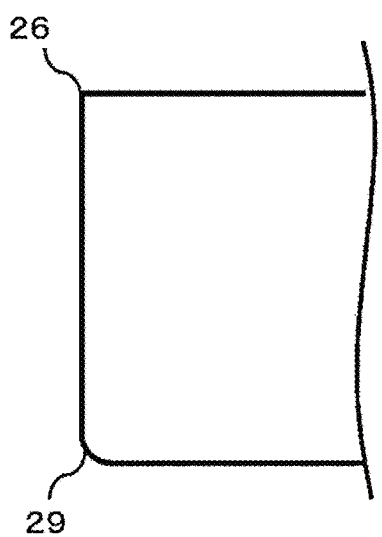
Figure 5:
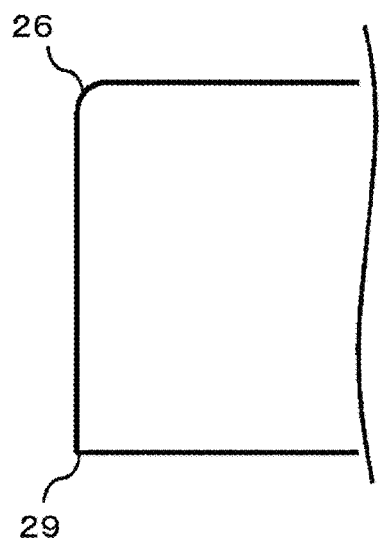

In the aspect illustrated in FIG. 5(a), the edge part 26 of the sealing recessed part 25 and the lower circumferential part 29 of the sealing part 20 are not chamfered. The edge part 26 may be chamfered, and as illustrated in FIG. 5(b), the edge part 26 of the sealing recessed part 25 and the lower circumferential part 29 of the sealing part 20 may be chamfered. In addition, presence or absence of chamfering of the edge part 26 of the sealing recessed part 25 and the lower circumferential part 29 of the sealing part 20 need not be matched with each other. As illustrated in FIG. 5(c), the edge part 26 of the sealing recessed part 25 may not be chamfered but the lower circumferential part 29 of the sealing part 20 may be chamfered. In contrast, as illustrated in FIG. 5(d), the edge part 26 of the sealing recessed part 25 may be chamfered, but the lower circumferential part 29 of the sealing part 20 may not be chamfered.

The sealing recessed part 25 may be provided over the entire side surface of the sealing part 20 (see the right side surface in FIG. 1), or may be provided only on part of one side surface (see the upper side surface, the lower side surface, and the left side surface in FIG. 1). In a case where the sealing recessed part 25 is provided only in part of one side surface, the sealing recessed part 25 may be provided so as to include the center of the side surface (the center in the direction along the "side" in plan view as illustrated in FIG. 1).

In a case where the sealing part 20 has a substantially quadrangular shape in plan view, the sealing recessed part 25 may be provided correspondingly to each side (see FIG. 1), or the sealing recessed parts 25 may be provided on a pair of sides facing each other. In a case where the sealing part 20 has a substantially rectangular shape in plan view, the sealing recessed parts 25 may be provided on a pair of short sides, or the sealing recessed parts 25 may be provided on a pair of long sides. Note that a "substantially quadrangular shape in plan view" means an aspect in which sides facing each other are parallel in plan view, and includes an aspect in which a corner part is rounded in plan view. A "substantially rectangular shape in plan view" means an aspect in which sides facing each other are parallel in plan view and there are short sides and long sides, and includes an aspect in which a corner part is rounded in plan view.

Figure 3:
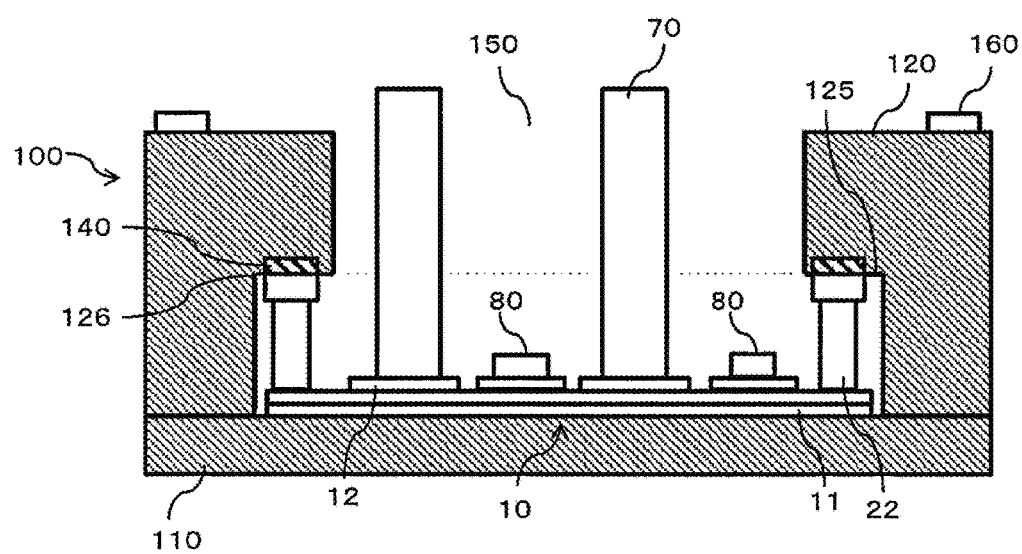
FIG. 3 is a side sectional view illustrating an aspect when the electronic device according to the embodiment of the present invention is manufactured.

As illustrated in FIG. 3, a mold 100 may have a back-surface-side mold 110 and a front-surface-side mold 120 placed on the front surface of the back-surface-side mold 110. The back-surface-side mold 110 and the front-surface-side mold 120 may be connected by a fastening member 160. The front-surface-side mold 120 may have a projecting part 125 corresponding to the sealing recessed part 25 of the electronic device. A mold-side edge part 126 corresponding to the edge part 26 of the sealing recessed part 25 is formed by the bottom surface of the projecting part 125 and the inner surface of the front surface side mold 120. Chamfering of the edge part 26 of the sealing recessed part 25 can be eliminated by setting the radius of the mold-side edge part 126 to be less than 0.5 mm, more preferably 0 mm.

The front-surface-side mold 120 may have an elastic body 140 such as packing positioned so as to come into contact with a top part of the insertion part 22. When the front-surface-side mold 120 is fastened to the back-surface-side mold 110 with the fastening member 160, the elastic body 140 is pressed against the top part of the insertion part 22. As a result, the metal plate 11 is pressed against the back-surface-side mold 110.

The front-surface-side mold 120 may be provided with an opening 150 for potting resin. Resin sealing may be performed by potting resin from the opening 150 of the front-surface-side mold 120 after the substrate 10, the electronic element 80, the insertion part 22, the terminal 70 and the like are placed in the mold 100

<<Operation and Effect>>

Next, operations and effects according to the present embodiment having the above-described configuration will be described. Any configuration described in "Operation and Effect" can be adopted.

In the present embodiment, in a case where an aspect in which the side surface of the sealing part 20 is exposed to the outside is adopted, there is no interface between the side surface of the sealing part 20 and the case, and it is possible to prevent the likelihood that a quality problem due to peeling or the like will occur.

In addition, in the case of adopting an aspect in which the sealing recessed part 25 is appropriately provided, the degree of freedom of design can be increased. As an example, in a case where an aspect in which the insertion part 22 is provided in the sealing recessed part 25 and the depth D of the insertion part 22 corresponds to the length H of the fastening member 90 (see FIG. 4), the thickness of the sealing recessed part 25 can be easily adjusted to a thickness corresponding to the length of the fastening member 90 and the length of the insertion part 22. Therefore, electronic devices of different types and forms can use identical fastening members 90 by setting the thickness of each sealing recessed part 25 to substantially an identical value, for example, a value within ±5% of the average value D0: D0×(1±0.05). As a result, it is possible to standardize parts, to reduce manufacturing costs, and to eliminate the risk of mix-up of parts in advance.

In addition, in a case of adopting an aspect in which the edge part 26 is not chamfered, as described above, by using the capillary phenomenon occurring between the edge part 26 and the mold 100, it is possible to promote resin to reach all over the edge part 26. This point will be explained in more detail. In terms of ease of handling and the like, in general, the edge part 26 is chamfered in many cases. However, in the case of adopting a potting sealing part for sealing by potting, since pressure is not applied or is hardly applied when resin sealing is performed, it is difficult for resin to reach the edge part 26. Particularly, with respect to the edge part 26 of the sealing recessed part 25, since the edge part 26 is the outer circumferential end part of a deep part, resin hardly reaches the edge part 26. Therefore, if the edge part 26 is chamfered, resin does not reach all over the edge part 26, resulting in generation of a large defect (void) in some cases. In contrast, by intentionally not chamfering the edge part 26, the capillary phenomenon occurring between the edge part 26 and the mold 100 can be used. Therefore, resin can reach even the outer circumferential end part of a deep part such as the edge part 26 of the sealing recessed part 25, and a large defect can be prevented from occurring.

It is considered that the reason why a large defect (void) tends to occur at the edge part 26 of the recessed sealing recessed part 25 is that since the edge part 26 is positioned at a deep location in the mold 100, air existing in the mold 100 is difficult to escape. In other words, in a case where resin is poured with little pressure as in potting, a gas such as air does not escape in some cases, and a large defect (void) is generated unless such a gas does not escape. In contrast, if the edge part 26 is not provided intentionally, it is possible to forcibly pour resin to the mold-side edge part 126 by using the capillary phenomenon, and to forcibly eliminate a gas such as air.

Only the edge part 26 may not be chamfered, and the other portions may be chamfered. In general, by chamfering a product, the product can be easily handled. Therefore, by adopting an aspect in which only the edge part 26 where a large defect (void) is likely to be generated is not chamfered and the other portions are chamfered, the likelihood that a large defect (void) will occur can be reduced while ease of handling can be maintained at maximum.

Figure 6:
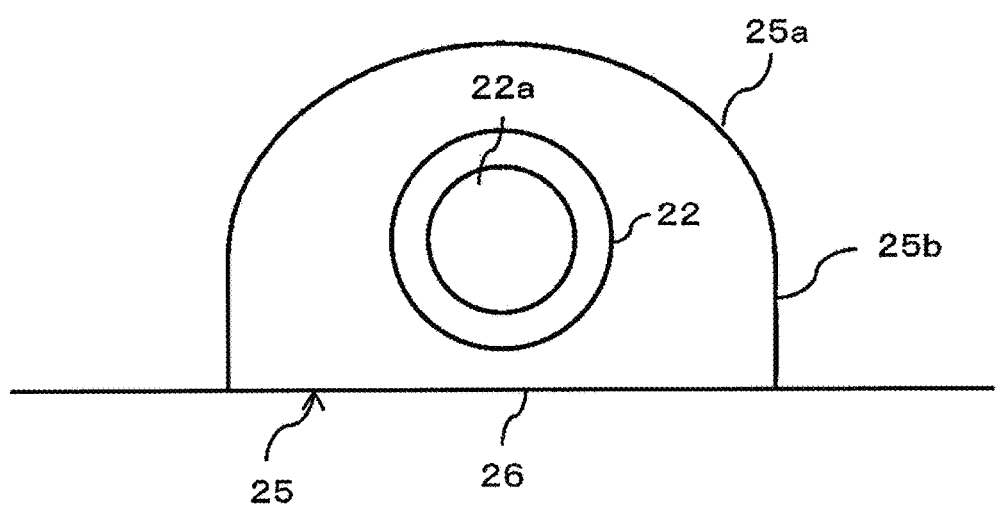
FIG. 6 is a plan view illustrating an example of the recessed part used in the embodiment of the present invention.

Compared to a case where the sealing recessed part 25 has a quadrangular shape (see the sealing recessed parts 25 provided on the left side surface and the right side surface in FIG. 1), if the sealing recessed part 25 has a part with an arc shape or a semicircular shape in plan view (see the sealing recessed parts 25 provided on the upper side surface and the lower side surface in FIG. 1), resin can easily flow from the inside toward an end part in the above part. As a result, resin can easily reach the edge part 26. In this respect, all of the sealing recessed parts 25 may have a part with an arc shape or a semicircular shape in plan view. In addition, as illustrated in FIG. 6, in plan view, the sealing recessed parts 25 may have an arcuate recessed part 25a with an arc shape or a semicircular shape and a quadrangular recessed part 25b with a quadrangular shape.

It is not necessary to reduce the radius over the entirety of the mold-side edge part 126. For example, the radius of the mold-side edge part 126 may be reduced only at a portion where a large defect (void) is likely to occur. As a result of examination, the inventor finds that a large defect is likely to occur at a portion including the center of the edge part 26 of the sealing recessed part 25. Therefore, in an aspect in which the edge part 26 is provided on part of one side surface, the radius of the mold-side edge part 126 may be set to be less than 0.5 mm at a portion including the center of the edge part 26 (for example, a central part obtained when the edge part 26 is divided into three equal parts), and the radius of the mold-side edge part 126 may be set to be greater than or equal to 0.5 mm at end parts of the mold-side edge part 126 (for example, parts other than the center part obtained when the edge part 26 is divided into three equal parts). As a result, chamfering is not performed at the portion including the center of the edge part 26 of the sealing recessed part 25, and chamfering is performed at the portions other than the above portion. It is considered that the reason why a large defect is likely to occur at the center of the edge part 26 of the sealing recessed part 25 as described above is that a gas such as air which has not escaped is finally positioned at the center of the edge part 26 of the sealing recessed part 25.

In addition, when the sealing recessed part 25 extends to the corner part in plan view (see the right side surface in FIG. 1), a state in which a gas is difficult to escape is likely to occur also in the corner part. Therefore, the radius of the mold-side edge part 126 may be set to be less than 0.5 mm at a portion including the corner part (for example, both end parts obtained when the edge part 26 is divided into five equal parts), a portion including the center of the edge part 26 of the sealing recessed part 25 (for example, the center part obtained when the edge part 26 is divided into five equal parts). The radius of the mold-side edge part 126 may be set to be greater than or equal to 0.5 mm between the portion including the corner part and the portion including the center of the edge part 26 of the sealing recessed part 25. As a result, chamfering is not performed at the portions including the corner part and the center of the edge part 26 of the sealing recessed part 25, and chamfering is performed at the portions other than the above portions.

Particularly, in a caseless aspect in which the sealing part 20 is exposed to the outside, if a defect occurs in the sealing part 20, the appearance becomes defective and the value as a product is lost. In addition, occurrence of a defect in the sealing part 20 as described above may affect properties (breakdown voltage failure or the like) of the product. Therefore, in the caseless aspect, the effect obtained by not chamfering the edge part 26 is extremely great.

In addition, in a case where an aspect in which the edge part 26 of the sealing recessed part 25 is not chamfered but the lower circumferential part 29 of the sealing part 20 is chamfered as illustrated in FIG. 5(c) is adopted, handling is made easier by chamfering the lower circumferential part 29, and the likelihood that a large defect (void) will occur can be reduced by not chamfering the edge part 26 of the sealing recessed part 25.

Note that adoption of a caseless aspect in which the entire side surface and the entire front surface of the sealing part 20 are exposed to the outside is advantageous in that manufacturing costs can be lowered by eliminating the case.

As illustrated in FIG. 2, in a case where an aspect in which the terminal 70 protrudes to the outside from the front surface of the sealing part 20, it is highly likely that sealing is performed by potting. In a case where potting described above is used, no pressure is applied or pressure is hardly applied when sealing with resin is performed. Therefore, as described above, it is very advantageous to use the capillary phenomenon occurring between the edge part 26 of the sealing recessed part 25 and the mold 100 by intentionally not chamfering the edge part 26 of the sealing recessed part 25.

<<Manufacturing Method>>

Next, processes for manufacturing an electronic device (a method for manufacturing an electronic device) according to the present embodiment having the above-described configuration will be described mainly with reference to FIG. 3. Any aspect described in "Configuration" and "Operation and Effect" which will be an overlapping description and therefore will not be stated, can be applied.

The substrate 10 on which the electronic element 80 and the terminal 70 are provided is placed on the back-surface-side mold 110 (substrate placing process).

Next, the insertion part 22 for inserting the fastening member 90 is placed (insertion part placing process). Note that the process of placing the insertion part 22 may be performed simultaneously with or before the process of placing the electronic element 80 and/or the terminal 70 on the conductor layer 13.

Next, the front-surface-side mold 120 is placed on the back-surface-side mold 110, and the front-surface-side mold 120 is fixed to the back-surface-side mold 110 by the fastening member 160. By fixing the front-surface-side mold 120 to the back-surface-side mold 110 by the fastening member 160 as described above, the top part of the insertion part 22 is pressed by the bottom surface of the projecting part 125 of the front-surface-side mold 120, part of the substrate 10 on a circumferential side is pressed by the bottom surface of the insertion part 22, and as a result, the substrate 10 is pressed against the back-surface-side mold 110.

Next, resin is poured between the front-surface mold 100 and the back-surface-side mold 110, for example, by potting (resin inflow process). Note that prior to pouring of resin by potting, the mold 100 may be warmed to about 85° C. by a preheating unit (preheating plate), and while resin is poured, the mold 100 may be warmed by the preheating unit (preheating plate) set at about 75° C. Performing preheating as described above is advantageous in that it is possible to prompt resin to flow to the edge part 26 of the sealing recessed part 25.

Next, resin is cured at a predetermined temperature to form the sealing part 20 (curing process).

Next, by removing the mold 100, a caseless electronic device in which the entire side surface and the entire front surface of the sealing part 20 are exposed to the outside is manufactured.

The description of the embodiment and the disclosure of the drawings described above are merely examples for explaining the invention described in the claims, and the invention described in the claims is not limited by the description of the embodiment or the disclosure of the drawings described above. In addition, the recitation of the claims at the original application is merely an example, and the recitation of the claims can be appropriately changed based on the description of the specification, the drawings, and the like.

REFERENCE SIGNS LIST

10 Substrate
20 Sealing part
22 Insertion part
25 Sealing recessed part
26 Edge part
70 Terminal
80 Electronic element
90 Fastening member
125 Projecting part
D Depth of insertion part
H Length of fastening member

The invention claimed is:

1. An electronic device comprising:
    a substrate;
    an electronic element provided on the substrate; and
    a sealing part for sealing the electronic element,
    wherein an insertion part for inserting a fastening member is provided,
    wherein the insertion part is provided in a sealing recessed part recessed compared with a circumferential region,
    wherein at least side surface and the sealing recessed part of the sealing part are exposed to outside,
    wherein the sealing recessed part has an edge part formed by the side surface and a front surface of the sealing recessed part, and
    wherein the edge part is not chamfered and other parts in upper side of the sealing part are chamfered.

2. The electronic device according to claim 1,
    wherein depth of the insertion part corresponds to length of the fastening member.

3. The electronic device according to claim 1,
    wherein a lower circumferential part of the sealing part is chamfered.

4. The electronic device according to claim 1,
    wherein an entire side surface and an entire front surface of the sealing part are exposed to the outside.

5. The electronic device, according to claim 1, further comprising
    a terminal connected to the electronic element and protruding to the outside from the front surface of the sealing part.

6. A manufacturing method for an electronic device comprising:
- a step of placing a substrate, on which an electronic element is provided, on a mold;
- a step of placing an insertion part for inserting a fastening member on the substrate; and
- a step of pouring resin which is a material of a sealing part, while apart of the substrate is pressed by the insertion part which is pressed by a projecting part of a mold,
- wherein the electronic device has a sealing recessed part, which corresponds to the projecting part of the mold, and at least side surface and the sealing recessed part of the sealing part are exposed to outside,
- wherein a mold has a back-surface-side mold and a front-surface-side mold placed on a front surface of the back-surface-side mold,
- wherein the front-surface-side mold has the projecting part,
- wherein a mold-side edge part is formed by a bottom surface of the projecting part and an inner side surface of the front-surface-side mold,
- wherein a radius of the mold-side edge part is less than 0.5 mm, and
- wherein the edge part is not chamfered and other parts in upper side of the sealing part are chamfered.

* * * * *